(12) United States Patent
Yoo

(10) Patent No.: US 7,816,969 B2
(45) Date of Patent: Oct. 19, 2010

(54) LEVEL SHIFTER CIRCUIT

(75) Inventor: Seung-Moon Yoo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1849 days.

(21) Appl. No.: 10/255,470

(22) Filed: Sep. 26, 2002

(65) Prior Publication Data

US 2010/0176864 A1    Jul. 15, 2010

(51) Int. Cl.
*H03L 5/00* (2006.01)
(52) U.S. Cl. ............................. 327/333; 326/80; 326/81
(58) Field of Classification Search ................. 327/333; 326/80, 81
See application file for complete search history.

(56) References Cited

U.S. PATENT DOCUMENTS 5,493,245 A * 2/1996 Kao et al. .................... 327/333
5,502,406 A * 3/1996 Traynor et al. ................. 326/68
6,002,290 A * 12/1999 Avery et al. .................. 327/333
6,259,299 B1 * 7/2001 Ryu ............................ 327/333

* cited by examiner

*Primary Examiner*—Lincoln Donovan
(74) *Attorney, Agent, or Firm*—Dillon & Yudell LLP

(57) ABSTRACT

A level shifter circuit is disclosed. The circuit receives a digital input signal characterized by a logical high state having a first high voltage level and generates an output node for driving a digital output signal characterized by a logical high state having a second high voltage level. The output signal logical state mirrors the input signal logical state. The circuit includes a short circuit current reduction mechanism for charging a first internal node of level shifter circuit following a first transition of the input signal logical state. The circuit further includes a performance enhancement mechanism for discharging the first internal node of the level shifter circuit following a second transition of the input signal logical state. The performance enhancement mechanism may comprise a transistor driven by the input signal and connected between the first internal node and ground. The current limiting mechanism may comprise a transistor having a source/drain terminal connected to the first internal node.

13 Claims, 4 Drawing Sheets

LEVEL SHIFTER CIRCUIT

BACKGROUND

1. Field of the Present Invention

The present invention generally relates to the field of electronic circuits and, more particularly, to a level shifter circuit suitable for use in a digital electronic device.

2. History of Related Art

Level shifter circuits are used in digital electronic devices to enable a translation within the device from one voltage level to another. Referring to FIG. 7, a digital electronic device is represented by reference numeral 10. Device 10 as depicted includes first circuitry 12, a level translation unit 14, and second circuitry 16. The operating supply voltage provided to first circuitry 12 differs from the supply voltage provided to second circuitry 16. In the depicted embodiment, for example, first circuitry 12 is provided with a supply voltage Vdd while second circuitry 16 is provided with a supply voltage HVdd. Circuits in first circuitry 12 typically comprise those circuits within device 10 capable of operating at a reduced voltage. All other factors remaining constant, operating at a reduced voltage beneficially reduces power consumption. Accordingly, it is desirable to reduce the supply voltage to as much circuitry as possible without jeopardizing the functionality of device 10. In any design, however, there will be circuits (second circuitry 16) that require the full supply voltage for which the technology was designed. These circuits may include circuits that comprise a critical speed path, circuits that are required to drive a significant current, and so forth.

To accomplish a reduced supply voltage for a portion of the device while providing the remainder of the device with a full supply voltage, a level shifter is typically necessary. Referring to FIG. 8, a circuit segment 20 is depicted in which a first inverter 22 comprising a p-channel transistor 26 and an n-channel transistor 24 is connected to a second inverter 28 having a p-channel transistor 32 and an n-channel transistor 30 connected as shown. The voltage supplied to first inverter 22 is Vdd while the voltage supplied to second inverter 28 is HVdd. When the input to first inverter 22 is LO, the output node 25 is at Vdd. In the absence of a level shifting circuit, this Vdd output voltage on node 25 may be connected to the input of an inverter circuit, such as inverter 28, that is supplied with the second supply voltage HVdd. If HVdd is greater than Vdd, there is a voltage difference ($Vgs_p$) across the source and gate terminals of p-channel transistor 32. If $Vgs_p$ approaches the threshold voltage of p-channel transistor 32, the transistor may turn on thereby creating an undesired current path between HVdd and ground. If, for example, HVdd is 1.5 V and Vdd is 0.9 V, Vgsp is roughly −0.6 V. As a rule of thumb, the threshold voltage for MOS transistors is roughly ⅓ of the supply voltage. Thus, the Vt of transistor 32 is roughly −0.4 to −0.5 volts. It will be appreciated, therefore, that transistor 32 is undesirably biased to be turned on and that a current path between HVdd and OUT occurs.

Level shifter circuits are intended to address this potential problem. FIG. 1 illustrates a conventional level shifter circuit 100. The basic level shifter circuit 100 includes a first transistor pair 102 and 104 having source/drain node connected in series between HVdd and ground and a second transistor pair 106 and 108 with source/drain nodes connected in series between HVdd and ground. Transistors 102 and 104 share a common node (A) and transistors 106 and 108 share a common node (the output node). Node A is connected to the input or gate of transistor 106 while the output node is connected to the gate of transistor 102. Transistors 102 and 106 are p-channel devices while transistors 104 and 108 are n-channel. The gate of transistor 104 is connected to an input node while the gate of transistor 108 is connected to the output of an inverter 110. The input node is also connected to the input of inverter 110 whereby the gate of transistor 108 receives the logical complement of the signal on the input node. The input node receives a signal from a circuit or logic gate that uses Vdd as a supply voltage. Thus, the logic HI level of the input signal is equal to Vdd.

Operationally, level shifter 100 is relatively simple. When the input node is LO, transistor 108 turns on to pull the output node LO. As the output node goes LO, transistor 102 turns on thereby pulling node A to HVdd, which cuts-off transistor 106. When the input node is HI, transistor 104 turns on thereby pulling node A LO and turning on transistor 106 to pull the output node to HVdd. In this manner, the Vdd input signal is shifted to an HVdd signal suitable for use in a circuit supplied with an HVdd supply voltage.

Ideally, the transistors in level shifter 100 turn on and off instantaneously so that the transition time is zero and no current path ever exists between HVdd and ground. In reality however, transistors 102 through 108 have finite impedances, even when fully on, that affect circuit performance. When the input node transitions from HI to LO, for example, node A must charge from Vss to a critical voltage of roughly HVdd−Vtp (where Vtp is the absolute value of the Vt of transistor 106) to cut-off transistor 106. Because node A is connected to the inherently capacitive gate terminal of transistor 106, however, the node A voltage cannot transition instantaneously. Instead, the node A voltage rises smoothly as the node is charged to HVdd. Before node A reaches the critical voltage, transistor 106 is on. Meanwhile, the node B at the input of transistor 108 is driven rapidly by the input signal from LO to HI thereby turning on transistor 108. If node B transitions HI faster than node A, transistors 106 and 108 will be on simultaneously for some finite duration. During this time, current flows freely and undesirably from HVdd to ground trough the source/drain paths of transistors 106 and 108. This undesirable current is referred to herein as the switching current or short-circuit current.

A complementary situation occurs when the input goes from LO to HI wherein a short-circuit current flows through transistors 102 and 104 while the output node charges from LO to the critical voltage. Generally speaking, however, because transistors 106 and 108 are typically required to drive input signals, they are typically designed as larger devices that conduct more current than transistors 102 and 104. Thus, the short-circuit current is of greater concern for the HI to LO case than vice versa for a typically designed level shifter.

It would therefore be desirable to implement a level shifting circuit that incorporates a short-circuit current reduction mechanism in conjunction with a transition time booster mechanism to compensate for transition time degradation attributable to the short-circuit reduction mechanism.

SUMMARY OF THE INVENTION

The problems identified above are addressed by a level shifter circuit as disclosed herein. The circuit receives a digital input signal characterized by a logical high state having a first high voltage level and generates an output node for driving a digital output signal characterized by a logical high state having a second high voltage level. The output signal logical state mirrors the input signal logical state. The circuit includes a short circuit current reduction mechanism for charging a first internal node of level shifter circuit following a first transition of the input signal logical state. The circuit further includes a performance enhancement mechanism for discharging the first internal node of the level shifter circuit following a second transition of the input signal logical state. The performance enhancement mechanism may comprise a transistor driven by the input signal and connected between the first internal node and ground. The current limiting mechanism may comprise a transistor having a source/drain terminal connected to the first internal node.

BRIEF DESCRIPTION OF THE DRAWINGS

Other objects and advantages of the invention will become apparent upon reading the following detailed description and upon reference to the accompanying drawings in which.

Figure 1:
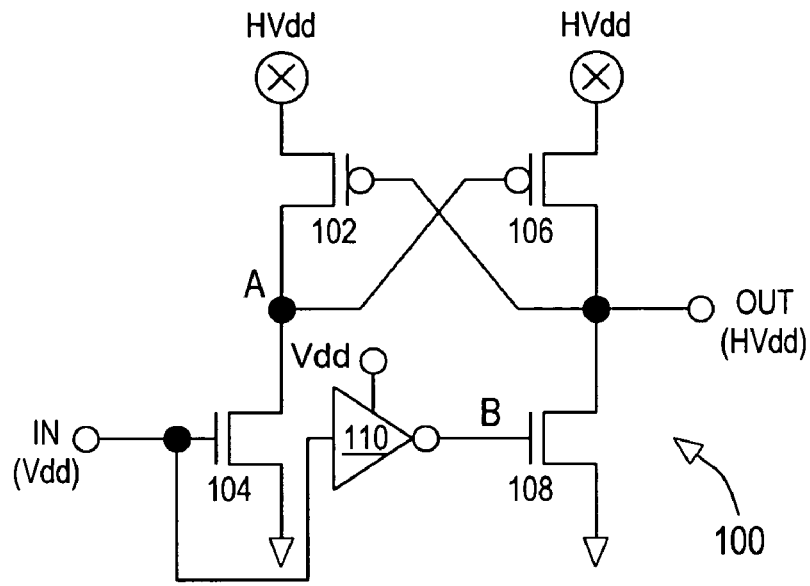
FIG. 1 is a circuit diagram of a level shifting circuit according to the prior art.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the present invention contemplates level shifting circuitry suitable for use in digital circuits that employ two (or more) supply voltage levels. The circuit according to the present invention includes an input node for receiving a digital signal characterized by a logical LO level and a first logical HI level where the voltage of the first logical HI level is Vdd. The circuit further includes an output node that reflects the logical state of the input node and is characterized by a logical LO level and a second logical HI level where the voltage of the second logical HI level is HVdd. The circuitry incorporates a short-circuit current reduction mechanism and may include a transition time booster to improve the overall performance and operating characteristics of the circuit. The circuit encompasses various implementations that are disclosed specifically herein, but is intended to capture other embodiments employing the material elements of the invention.

Figure 2:
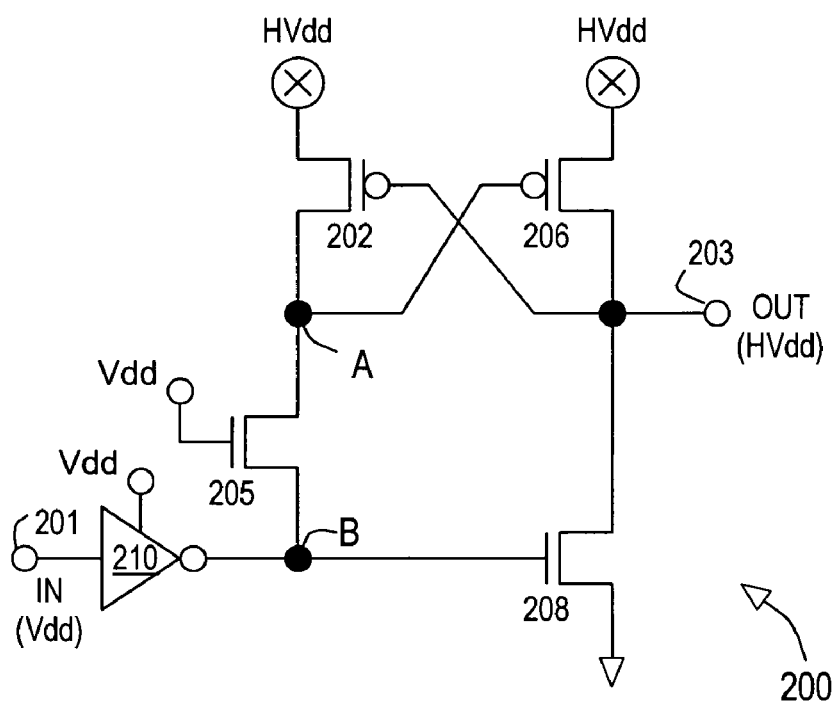
FIG. 2 is a circuit diagram of a level shifting circuit incorporating short-circuit current reduction according to the prior art.

Referring to FIG. 2, a circuit 200 includes an input node 201 designed to receive a digital input signal where the input signal is characterized by or capable, during normal operation, of assuming a LO state, which is typically equal to 0 V, ground, or Vss, and a first logical HI state, having a voltage level of Vdd. Circuit 200 further includes an output node 203 for driving an digital output signal characterized by a logical LO state and a second logical HI state having a voltage of HVdd. HVdd and Vdd are different voltage levels, where HVdd is typically greater than Vdd.

Circuit 200 as depicted includes a pair of cross-coupled p-channel transistors 202 and 206, each having one source/drain terminal connected to HVdd. The remaining source/drain terminal of transistor 202 is connected to a Node A and to a gate terminal of transistor 206. The remaining source/drain terminal of transistor 206 is connected to the output node 203 and to the gate terminal of transistor 202. Circuit 200 further includes an n-channel transistor 208, configured to receive a logical complement (via an inverter 210) of the input signal on node 201. Input node is 201 is connected directly to the input of inverter 210. The output of inverter 210, identified as Node B, is connected to the gate terminal of transistor 208. FIG. 2 further includes an n-channel transistor 205 with source/drain terminals connected between Node A and Node B and a gate terminal connected to Vdd.

The output signal on node 203 is configured to reflect the input signal on node 201. More specifically, the logical level of the output signal tracks the logical level of input signal wherein a logical LO level on input node 201 produces a logical LO level on output node 203 while a logical HI level on input node 201 produces a logical HI level on output node 203. Typically, the voltage level of the logical LO state is Vss for input node 201 as well as node 203. The voltage level of the logical HI state on input node 201 is Vdd and the voltage level of logical HI state on output node 203 is HVdd. Thus, a signal with a voltage level of approximately Vdd at the input node 201 of circuit 200 produces a signal with a voltage level of HVdd on output node 203.

Transistor 205 of circuit 200 comprises a short circuit current limiting mechanism. When the input node goes from HI to LO, inverter 210 drives node B HI and node A begins to charge from LO to a voltage (Vdd−Vtn(205), where Vtn(205) is a threshold voltage of transistor 205) to reduce $V_{gs}$ of transistor 206 and thus, reduce the short current from HVdd to ground through transistors 206 and 208. In this state, transistor 205 is on until the voltage of node A reaches Vdd−Vtn. Thus, instead of relying solely on transistor 202 to provide current to charge node A (which has an inherent capacitance), the additional current provided by transistor 205 charges node A faster than the corresponding node A of circuit 100 is charged. In this manner, circuit 200 beneficially reduces the HI to LO short circuit current by cutting off transistor 206 more rapidly.

The improvement in short circuit current achieved by circuit 200 is partially offset by a performance reduction in the LO to HI transition. More specifically, the input node goes from LO to HI, node A must discharge from HI to LO. The discharge path includes transistor 205 and the n-channel transistor inherent in inverter 210. It will be appreciated that the resistance of this discharge path is greater than the resistance of the analogous discharge path of circuit 100 where node A discharges through the single transistor 104.

Figure 3:
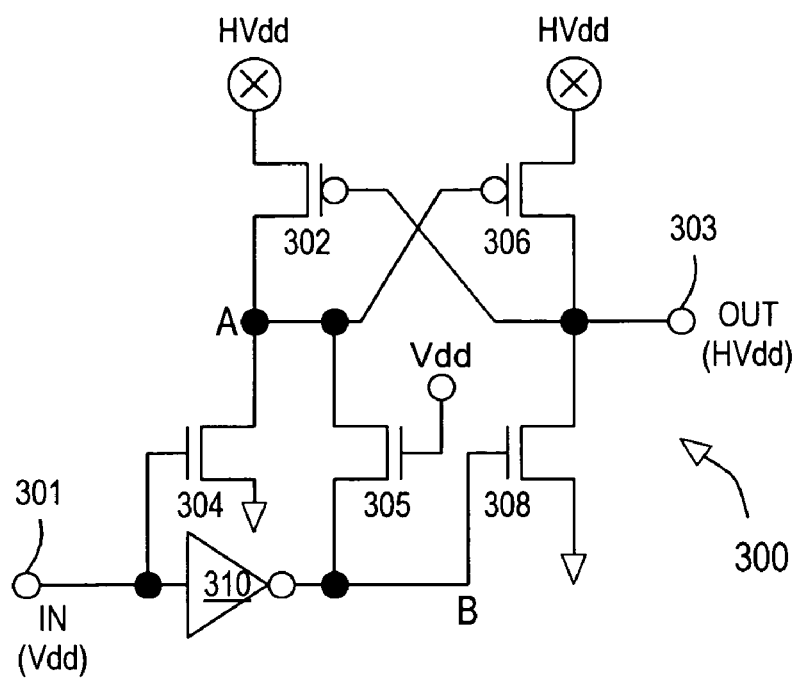
FIG. 3 is a circuit diagram of a first embodiment of a level shifting circuit according to the present invention.

Referring now to FIG. 3, a level shifter circuit 300 according to a one embodiment of the present invention is depicted. Analogous to circuit 200, circuit 300 includes an input node 301 designed to receive a digital input signal having a LO state with a voltage level of Vss and a first HI state having a voltage level equal to Vdd. Circuit 300 further includes an output node 303 driving a LO state having a voltage level of Vss and a second HI state having a voltage level of HVdd.

Circuit 300 as depicted includes a pair of cross-coupled p-channel transistors 302 and 306, each having one source/ drain terminal connected to HVdd. The remaining source/drain terminal of transistor 302 is connected to a Node A and to a gate terminal of transistor 306. The remaining source/drain terminal of transistor 306 is connected to the output node 303 and to the gate terminal of transistor 302. Circuit 300 further includes a pair of n-channel transistors 304 and 308, configured to receive complementary copies (via an inverter 310) of the input signal on node 301. Input node is 301 is connected directly to the gate terminal of transistor 304 and to the input of inverter 310. The output of inverter 310, identified as Node B, is connected to the gate terminal of transistor 308. FIG. 3 further includes a transistor 305 with source/drain terminals connected between Node A and Node B and a gate terminal connected to Vdd.

Transistors 304 and 305 of circuit 300 comprise a short circuit current limiting mechanism for HI to LO transitions of input node 301 as well as a performance enhancement mechanism for improving the output node transition during a LO to HI transition. Transistor 305 limits short circuit current limiting mechanism by providing a second current source to charge Node A as it charges from Vss to a voltage sufficient to turn off p-channel transistor 306 in the same manner as described with respect to transistor 205 of circuit 200. In addition, circuit 300 incorporates an n-channel transistor 304 having a gate terminal connected to input node 301 and having source/drain terminals connected between node A and Vss. Transistor 304 boosts performance during LO to HI transitions of the input signal by providing a low resistance path to discharge node A sufficiently to turn on transistor 306. Thus, instead of a discharge current path comprising the channel resistance of two transistors in series as is the case for Node A of circuit 200, the Node A discharge path in circuit 300 comprises the channel resistance of a single transistor.

Figure 4:
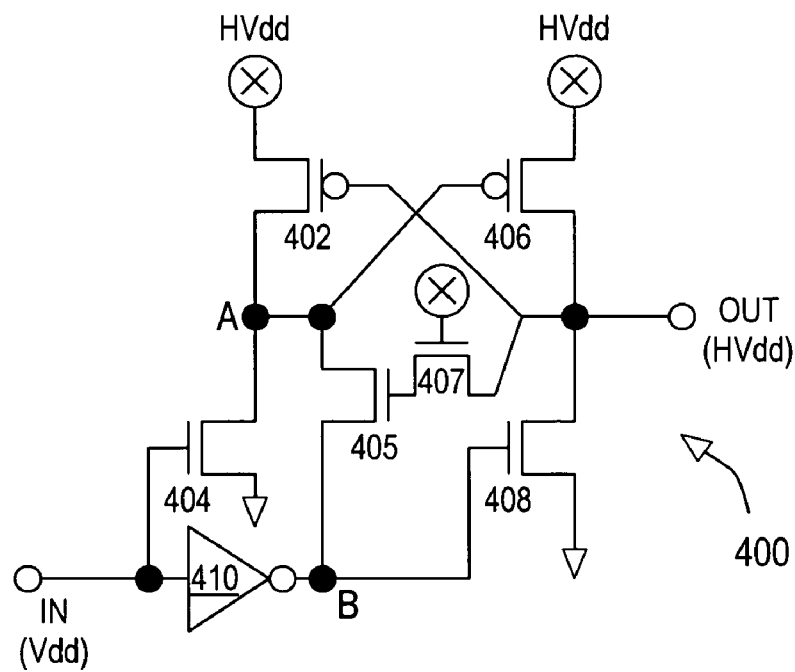
FIG. 4 is a circuit diagram of a second embodiment of a level shifting circuit according to the present invention.

Referring now to FIG. 4, a level shifting circuit 400 according to another embodiment of the invention is illustrated. Circuit 400 is analogous to circuit 300 and includes transistors 402, 404, 405, 406, and 408 that correspond functionally to transistors 302, 304, 305, 306, and 308 of circuit 300. In circuit 400, however, the gate terminal of short circuit current limiting transistor 405 is connected to a first source/drain terminal of a transistor 407. The remaining source/drain terminal of transistor 407 is connected to the output node while the transistor's gate terminal is connected to HVdd. This configuration incorporates a voltage bootstrap to charge Node A more rapidly following a HI to LO input node transition. With the input node HI, the gate terminal of transistor 405 is precharged to a voltage roughly equal to Hvdd−Vtn, wherein Vtn is the threshold voltage of transistor 407. When node B is driven to Vdd by inverter 410 following a HI to LO transition of the input node, the voltage at the transistor 405 gate terminal is bootstrapped to Hvdd−Vtn+K*Vdd, where K represents a bootstrapping efficiency determined at least in part by the size ratio of transistors 405 and 407. Because of the higher voltage level on the transistor 405 gate terminal, node A can charge to full Vdd (before transistor 402 turns on) whereas, in circuit 300, node A can only obtain a voltage of Vdd−Vtn before turning off transistor 305. Because full Vdd is a higher voltage than Vdd−Vtn, transistor 406 is more fully off in circuit 400 than transistor 306 in circuit 300 at any point in time of the node A low to high transition.

Figure 5:
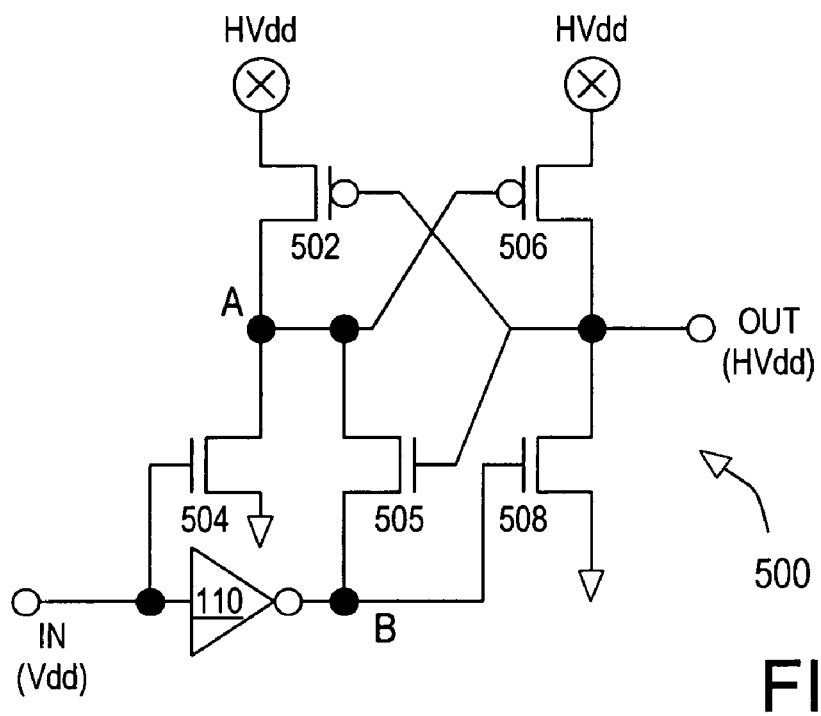
FIG. 5 is a circuit diagram of a third embodiment of a level shifting circuit according to the present invention.

Referring now to FIG. 5, the depicted embodiment of a level shifter circuit 500 includes a short circuit current limiting transistor 505 analogous to transistor 305 in circuit 300 and transistor 405 in circuit 400. Unlike the gate terminal of transistor 305, however, the transistor 505 gate terminal is connected to the output node. When the input node is HI, the output node voltage level is HVdd. Following an input node HI to LO transition, node B is driven to Vdd before the output node can discharge from HVdd. Node A can therefore, charged to roughly Vdd.

Figure 6:
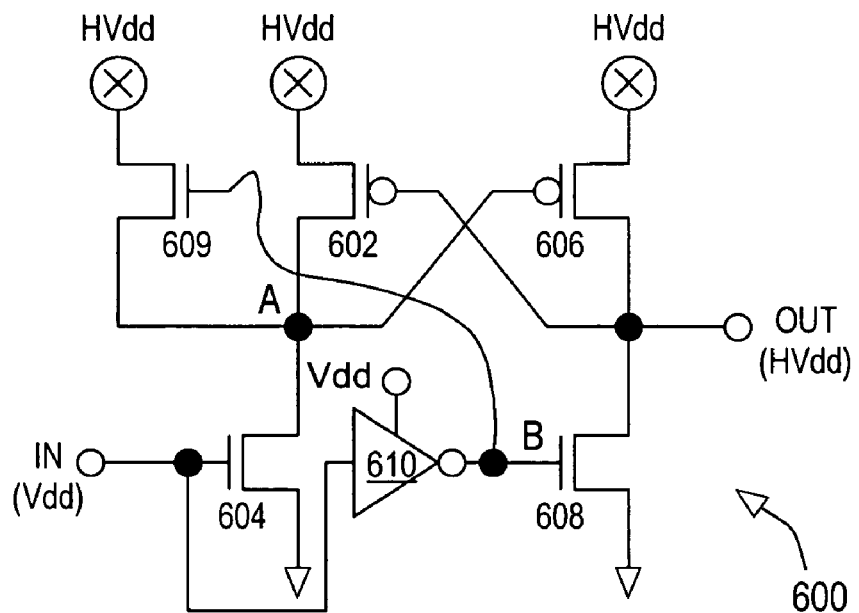
FIG. 6 is a circuit diagram of a fourth embodiment of a level shifting circuit according to the present invention.
Figure 7:
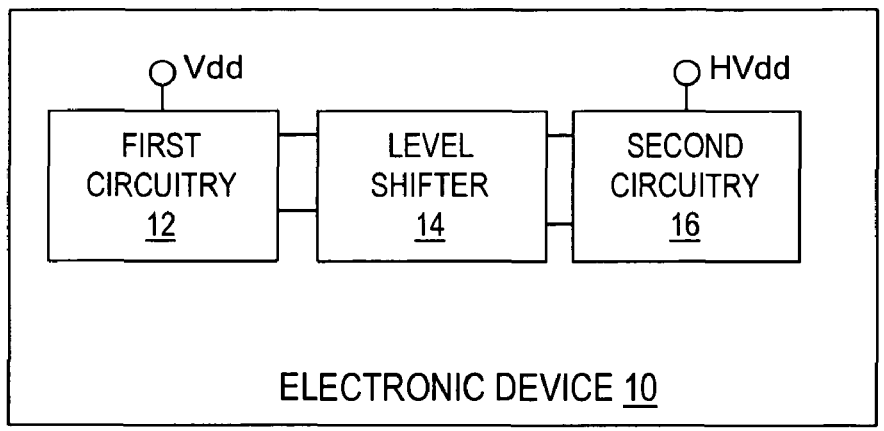
FIG. 7 is a block diagram of selected elements of an electronic device in which a level shifting circuit may be suitably employed.
Figure 8:
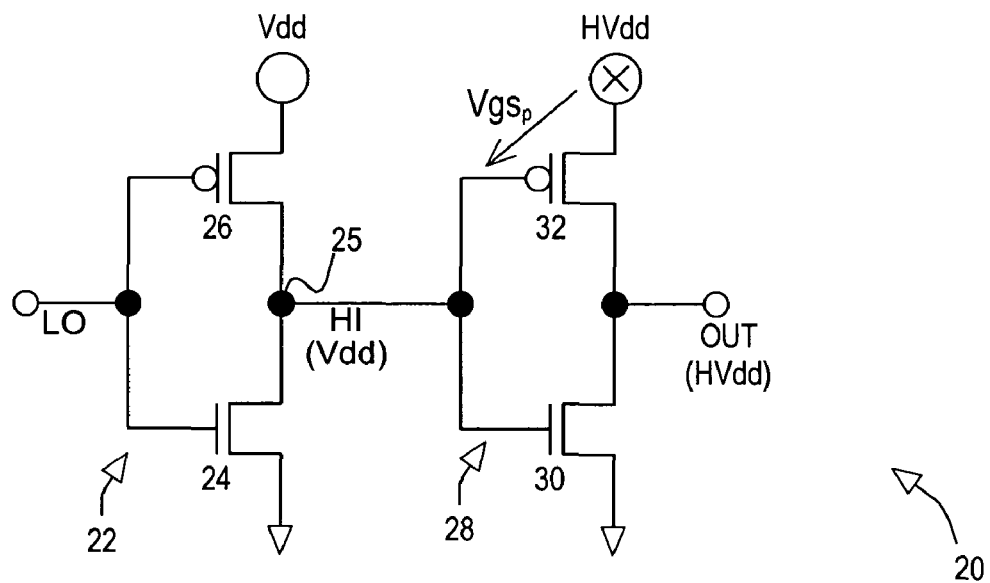
FIG. 8 is a circuit diagram illustrating the need for level shifting circuitry.

In FIG. 6, a level shifting circuit is depicted in which the short circuit current limiting mechanism comprises a transistor 609 having its source/drain terminals connected between node A and HVdd and a gate terminal connected to node B. In this configuration, the action of transistor 609 is not determined by the output node voltage, which decays following a high to low transition of the input node. When node B is driven to Vdd as the input node goes LO, node A starts to be charged to Vdd−Vtn. In this configuration, node B is constrained by only the gate capacitance of transistor 609, whereas in FIGS. 3 through 5, node B is affected by a source-to-gate capacitance of the current limiting transistor.

It will be apparent to those skilled in the art having the benefit of this disclosure that the present invention contemplates various embodiments of a level shifter circuit that includes short circuit current reduction and transition performance booster mechanisms. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A level shifter circuit, comprising:
an input node for receiving a digital input signal characterized by a logical high state having a first high voltage level;
an output node for driving a digital output signal characterized by a logical high state having a second high voltage level, wherein the output signal logical state mirrors the input signal logical state;
a short circuit current reduction transistor, having a first source/drain terminal connected to a first internal node and a second source/drain terminal connected to a second internal node and a gate terminal connected to the output node, for charging the first internal node of level shifter circuit following a first transition of the input signal logical state; and
a performance enhancement transistor having source/drain terminals connected between the first internal node and ground and having a gate terminal connected to the input node for discharging the first internal node of the level shifter circuit following a second transition of the input signal logical state, wherein the first transition and the second transition differ.

2. The circuit of claim 1, wherein the first internal node is connected to a p-channel output transistor configured to pull the output node to a logical high state when the input node transitions high.

3. A level-shifter circuit, comprising:
a p-channel output transistor having a first source/drain terminal connected to an output node, a gate terminal connected to a first control node, and a second source/drain terminal connected to a first voltage supply node;
an n-channel output transistor having a first source/drain terminal connected to the output node, a gate terminal connected to a second control node, and a second source/drain terminal connected to a second voltage supply node;
an input node for receiving a digital input signal characterized by a first logical state having a voltage level of Vdd and a second logical state having a voltage level of Vss;

an inverter having an input directly connected to the input node and an output connected directly to the gate terminal of the n-channel output transistor;

means for conveying the logical level of the input signal to the output signal wherein a logical high input signal produces a logical high output signal on the output node having a voltage level of HVdd;

means connecting the first control node to the second control node for turning off the p-channel output transistor when the input signal transitions from high to low; and means for connecting the first control node to Vss when the input signal transitions from low to high.

4. The circuit of claim 3, wherein the first supply voltage has a voltage level of HVdd and the second supply voltage has a voltage of Vss, wherein HVdd is greater than Vdd and Vss is approximately 0V.

5. The circuit of claim 3, wherein the means connecting the first and second control nodes comprises a third transistor having first and second source/drain terminals connected between the first and second control nodes respectively.

6. The circuit of claim 5, wherein the gate terminal of the third transistor is connected to a Vdd supply voltage node.

7. The circuit of claim 5, wherein the gate terminal of the third transistor is connected to the output node.

8. The circuit of claim 5, wherein the gate terminal of the third transistor is connected to a first source/drain terminal of a fourth transistor, the fourth transistor having a second source/drain terminal connected to the output node, and a gate terminal connected to a supply voltage node.

9. The circuit of claim 8, wherein the supply voltage node to which the fourth transistor gate terminal is connected comprises an HVdd supply voltage node.

10. The circuit of claim 3, wherein the means connecting the first and second control nodes comprises a third transistor having a first source/drain terminal connected to the first control node, a second source/drain terminal connected to a supply voltage, and a gate terminal connected to the second control node.

11. The circuit of claim 3, wherein the means for connecting the first control node to Vss comprises a transistor having a first source/drain terminal connected to Vss, a second source/drain terminal connected to the first control node, and a gate terminal connected to the input node.

12. The circuit of claim 3, wherein the mean connecting the first and second control nodes comprises an n-channel transistor connected between the first and second control nodes for conducting current to the first control node following a high to low transition of the input signal and wherein the means for connecting the first control node to Vss comprises a n-channel transistor for discharging the first control node following a low to high transition of the input signal.

13. A level shifter circuit, comprising:

an input node for receiving a digital input signal characterized by a logical high state having a first high voltage level;

an output node for driving a digital output signal characterized by a logical high state having a second high voltage level, wherein the output signal logical state mirrors the input signal logical state;

a short circuit current limiting transistor, having a first source/drain terminal connected to the first internal node and a second source/drain terminal connected to a second internal node and a gate terminal connected to a source/drain terminal of a bootstrapping transistor, for charging a first internal node of level shifter circuit following a first transition of the input signal logical state;

a performance enhancement transistor having source/drain terminals connected between the first internal node and ground and having a gate terminal connected to the input node for discharging the first internal node of the level shifter circuit following a second transition of the input signal logical state, wherein the first transition and the second transition differ.

* * * * *